(12) United States Patent
Nakai

(10) Patent No.: US 6,504,115 B2
(45) Date of Patent: Jan. 7, 2003

(54) MULTIDIRECTIONAL INPUT DEVICE

(75) Inventor: Takashi Nakai, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 1 day.

(21) Appl. No.: 09/800,837

(22) Filed: Mar. 7, 2001

(65) Prior Publication Data

US 2002/0056621 A1 May 16, 2002

(30) Foreign Application Priority Data

Mar. 7, 2000 (JP) ........................................ 2000-067165
Mar. 7, 2000 (JP) ........................................ 2000-067166

(51) Int. Cl.[7] ........................... H01H 25/04; G06F 3/033
(52) U.S. Cl. ........................................ 200/6 A; 200/600
(58) Field of Search ................................ 200/5 R, 5 A, 200/6 A, 600; 345/161, 184; 235/145 R; 341/22–35; 361/288

(56) References Cited

U.S. PATENT DOCUMENTS 4,364,047 A * 12/1982 Archer ....................... 200/6 A
4,620,176 A * 10/1986 Hayes ......................... 338/128
5,421,213 A    6/1995 Okada .................... 73/862.043
6,078,247 A *  6/2000 Shimomura ............. 200/6 A X
6,373,265 B1 * 4/2002 Morimoto et al. .......... 324/686

* cited by examiner

Primary Examiner—J. R. Scott
(74) Attorney, Agent, or Firm—Brinks Hofer Gilson & Lione

(57) ABSTRACT

A multidirectional input device comprising a frame having an upper wall, a printed wiring board having a fixed electrode portion, and an operating shaft adapted to be tilted, wherein a movable electrode portion is attached to the operating shaft in an opposed relation to the fixed electrode portion, an opposition area between the movable electrode portion and the fixed electrode portion is changed by operation of the operating shaft, and a change in capacitance between the movable electrode portion and the fixed electrode portion is detected to obtain an operational direction of the operating shaft.

12 Claims, 4 Drawing Sheets

MULTIDIRECTIONAL INPUT DEVICE

BACKGROUND OF THE INVENTION

1. Field of the Invention

The present invention relates to a multidirectional input device and more particularly to a multidirectional input device wherein, by tilting an operating shaft, a variable condenser is operated and an operational direction of the operating shaft can be inputted.

2. Description of the Prior Art

A multidirectional input device has heretofore been used as a controller for a computer game machine or as a balance controller for four speakers disposed in front, rear, right and left positions of, for example, a four-channel home theater system or a car audio system.

A conventional multidirectional input device will be described below with reference to FIGS. 5 and 6, of which FIG. 5 is a longitudinal sectional view of the conventional multidirectional input device and FIG. 6 is a transverse sectional view thereof.

As shown in FIGS. 5 and 6, a support portion 33a of an operating lever 33 is supported by an upper wall 31a of a casing 31 through a swivel bearing 32, the operating lever 33 being tiltable at a predetermined angle in an arbitrary direction.

A generally U-shaped first arm 34 and a generally U-shaped second arm 35 are disposed substantially crosswise in the interior of the casing 31, the first arm 34 being rotatable about Y axis which extends in Y axis direction (the vertical direction in FIG. 6) and the second arm 35 rotatable about X axis which extends in X axis direction (the right and left direction in FIG. 6). More specifically, one end portion of the first arm 34 is supported pivotably with a pin 36 which extends through a side wall 31b of the casing 31, while an opposite end portion of the first arm 34 is fixed to an input shaft 38 which is rotatable at a predetermined angle, the input shaft 38 projecting outwards from a first variable resistor 37 and passing through a side wall 31b of the casing 31, the first variable resistor 37 being attached to an outer surface side of the casing side wall 31b.

As to the second arm 35, one end portion thereof is supported pivotably with a pin 39 which extends through a side wall 31b of the casing 31, while an opposite end portion of the second arm 35 is fixed to an input shaft 41 which is rotatable at a predetermined angle, the input shaft 41 projecting outwards from a second variable resistor 40 and passing through a side wall 31b of the casing 31, the second variable resistor 40 being attached to an outery surface side of the casing side wall 31b.

Longitudinally extending elongated holes 42 and 43 are formed in the first and second arms 34, 35, respectively. A lower end portion of the operating lever 33 extends through both elongated holes 42 and 43. Therefore, when the operating lever 33 is tilted in an arbitrary direction, the input shaft 38 of the first variable resistor 37 rotates in accordance with the tilt angle in the X-axis direction of the operating lever 33 and the input shaft 41 of the second variable resistor 40 rotates in accordance with the tilt angle in the Y-axis direction of the operating lever 33.

Though not shown, the first and second variable resistors 37, 40 are each provided with an insulating substrate having printed carbon resistor and electrode terminals, a slider adapted to slide on the carbon resistor, terminals connected to the electrode terminals, and a housing which houses those components therein.

An amplifier substrate 45 is attached to an outer surface side of a side wall 31b of the casing 31 through plural brackets 44 formed of an insulator, and an amplifier circuit (not shown) constituted by an integrated circuit for example is mounted on the amplifier substrate 45.

The operation of this conventional multidirectional input device will be described below.

First, when the operating lever 33 is tilted in an arbitrary direction, the first arm 34 turns about the pin 36 and at the same time the second arm 35 turns about the pin 39. The turning angle of the first arm 34 corresponds to the tilt angle in the X axis direction of the operating lever 33 and the input shaft 38 of the first resistor 37 rotates together with the first arm 34. Consequently, the resistance value of the first variable resistor 37 varies in accordance with the tilt angle in the X axis direction of the operating lever 33.

Likewise, the turning angle of the second arm 35 corresponds to the tilt angle in the Y axis direction of the operating lever 33 and the input shaft 41 of the second variable resistor 40 rotates together with the second arm 35. Consequently, the resistance value of the second variable resistor 40 varies in accordance with the tilt angle in the Y axis direction of the operating lever 33.

That is, X and Y components of inclination of the operating lever 33 are detected on the basis of changes in resistance value of the first and second variable resistors 37, 40, whereby, for example, it is possible to control the motion of characters in a computer game machine or control the balance of four speakers disposed in front, rear, right and left positions of a four-channel home theater system or a car audio system.

In the conventional multidirectional input device, as described above, the resistance values of the first and second variable resistors 37, 40 vary upon tilting of the operating lever 33 in an arbitrary direction. However, since the first and second variable resistors 37 and 40 are each provided with an insulating substrate having a carbon resistor and electrode terminals, a slider, terminals, and a housing, the number of components is large and hence the number of assembling steps increases, that is, the cost of each variable resistor becomes high, thus giving rise to the problem that the multidirectional input device becomes expensive.

SUMMARY OF THE INVENTION

The present invention has been accomplished for solving the above-mentioned problems and it is an object of the invention to provide a multidirectional input device small in the number of components, superior in assemblability and less expensive.

According to the present invention, in the first aspect thereof, there is provided a multidirectional input device comprising a frame having an upper wall, a printed wiring board which closes a lower portion of the frame and which has a fixed electrode portion, and an operating shaft supported by the frame and adapted to be tilted with respect to the upper wall of the frame, wherein a movable electrode portion is attached to the operating shaft in an opposed relation to the fixed electrode portion and is moved by operation of the operating shaft to change an opposition area between the movable electrode portion and the fixed electrode portion, and a change in capacitance between both electrode portions is detected to obtain an operational direction of the operating shaft.

In the second aspect of the present invention there is provided, in combination with the above first aspect, a multidirectional input device wherein an interlocking member having a longitudinal slot is mounted bridgewise in the interior of the frame, the operating shaft is inserted into the slot and is supported by the interlocking member, the operating shaft can be tilted in both the longitudinal direction of the slot and a direction intersecting the longitudinal direction of the slot, and when the operating shaft is tilted in the longitudinal direction of the slot, only the operating shaft rotates, while when the operating shaft is tilted in the direction intersecting the longitudinal direction of the slot, the interlocking member rotates, centered on the longitudinal direction, with rotation of the operating shaft.

In the third aspect of the present invention there is provided, in combination with the above first aspect, a multidirectional input device wherein a slide member is disposed on an upper surface of the printed wiring board so that it can be moved along the upper surface of the printed wiring board by a tilting motion of the operating shaft, and the movable electrode portion is fixed to the slide member and is moved in parallel with the fixed electrode portion by a tilting motion of the operating shaft.

In the fourth aspect of the present invention there is provided, in combination with the above first aspect, a multidirectional input device wherein the fixed electrode portion is formed by a conductor pattern on an upper surface of the printed wiring board.

In the fifth aspect of the present invention there is provided, in combination with the above first aspect, a multidirectional input device wherein the fixed electrode portion has an earth electrode and a first fixed electrode adjacent to the earth electrode, the earth electrode and the first fixed electrode being opposed to the movable electrode portion, and a change in capacitance between the fixed electrode portion and the movable electrode portion caused by movement of the movable electrode portion is detected through the earth electrode opposed to the movable electrode portion.

In the sixth aspect of the present invention there is provided, in combination with the above first aspect, a multidirectional input device wherein the fixed electrode portion comprises four earth electrodes arranged crosswise and first, second, third and fourth fixed electrodes each disposed between adjacent the earth electrodes, the fixed electrode portion is formed in a generally circular shape by the earth electrodes and the first to fourth fixed electrodes, the earth electrodes and the first to fourth fixed electrodes being opposed to the movable electrode portion which is formed in a circular shape, changes in capacitance between each of the first to fourth fixed electrodes and the movable electrode portion caused by movement of the movable electrode portion are detected through the earth electrodes opposed to the movable electrode portion, a displacement in X direction of the operating shaft is detected by calculating a difference between the sum of a capacitance value between the first fixed electrode and the movable electrode portion and a capacitance value between the second fixed electrode and the movable electrode portion and the sum of a capacitance value between the third fixed electrode and the movable electrode portion and a capacitance value between the fourth fixed electrode and the movable electrode portion, a displacement in Y direction of the operating shaft is detected by calculating a difference between the sum of a capacitance value between the first fixed electrode and the movable electrode portion and a capacitance value between the fourth fixed electrode and the movable electrode portion and the sum of a capacitance value between the second fixed-electrode and the movable electrode portion and a capacitance value between the third fixed electrode and the movable electrode portion, and a tilting direction of the operating shaft is detected from the calculation results of the displacements in X and Y directions.

In the seventh aspect of the present invention there is provided, in combination with the above first aspect, a multidirectional input device wherein an insulating film is disposed between the movable electrode portion and the fixed electrode portion, and the movable electrode portion slides in contact with an upper surface of the insulating film.

In the eighth aspect of the present invention there is provided, in combination with the above seventh aspect, a multidirectional input device wherein the insulating film is disposed on the printed wiring board so as to cover the fixed electrode portion and is sandwiched between the printed wiring board and the lower portion of the frame.

In the ninth aspect of the present invention there is provided a multidirectional input device comprising a first interlocking member having a first longitudinal slot, a second interlocking member disposed in a direction orthogonal to the longitudinal direction of the first interlocking member and having a second longitudinal slot, a frame within which the first and second interlocking members are bridgewise mounted rotatably, a printed wiring board which closes a lower portion of the frame, and an operating shaft inserted into the first and second slots, supported by the first and second interlocking members and adapted to tilt in the longitudinal directions of the first and second slots, wherein movable electrode portions are fixed to the first and second interlocking members respectively, fixed electrode portions are fixed to the printed wiring board in an opposed relation to the movable electrode portions, the first and second interlocking members are rotated, centered on the longitudinal directions of the first and second slots respectively, by operation of the operating shaft, thereby rotating the movable electrode portions to change an opposition area between each movable electrode portion and each fixed electrode portion, and a change in capacitance between each movable electrode portion and each fixed electrode portion is detected to obtain an operational direction of the operating shaft.

In the tenth aspect of the present invention there is provided, in combination with the ninth aspect, a multidirectional input device wherein one end portions of the first and second interlocking members project outwards from the frame, the movable electrode portions are fixed to the end portions respectively, and the fixed electrode portions are disposed outside the frame.

In the eleventh aspect of the present invention there is provided, in combination with the ninth aspect, a multidirectional input device wherein the fixed electrode portions each comprise an earth electrode and a first fixed electrode adjacent to the earth electrode, the earth electrode and the first fixed electrode being opposed to the associated movable electrode portion, and a change in capacitance between the first fixed electrode and the associated movable electrode portion caused by rotation of the movable electrode portion is detected through the earth electrode opposed to the movable electrode portion.

In the twelfth aspect of the present invention there is provided, in combination with the ninth aspect, a multidirectional input device wherein the fixed electrode portions each comprise an earth electrode and a pair of first and second fixed electrodes adjacent to both sides of the earth electrode, the earth electrode and the first and second fixed electrodes being opposed to the associated movable electrode portion, an opposition area between the first fixed electrode and the associated movable electrode portion and an opposition area between the second fixed electrode and the movable electrode portion are equal to each other when the operating shaft is in a position perpendicular to the printed wiring board, and a change in capacitance between the first fixed electrode and the associated movable electrode portion and a change in capacitance between the second fixed electrode and the movable electrode portion both caused by rotation of the movable electrode portion are detected through the earth electrode opposed to the movable electrode portion.

In the thirteenth aspect of the present invention there is provided, in combination with the ninth aspect, a multidirectional input device wherein the movable electrode portions and the fixed electrode portions are respectively formed by metallic plates, one end portions of the metallic plates serving as the movable electrode portions are press-fitted into slits formed in the first and second interlocking members respectively, and the metallic plates serving as the fixed electrode portions- are soldered directly to the printed wiring board.

DETAILED DESCRIPTION OF THE PREFERRED EMBODIMENTS

Multidirectional input devices embodying the present invention will be described in detail hereinunder with reference to the accompanying drawings.

Figure 1:
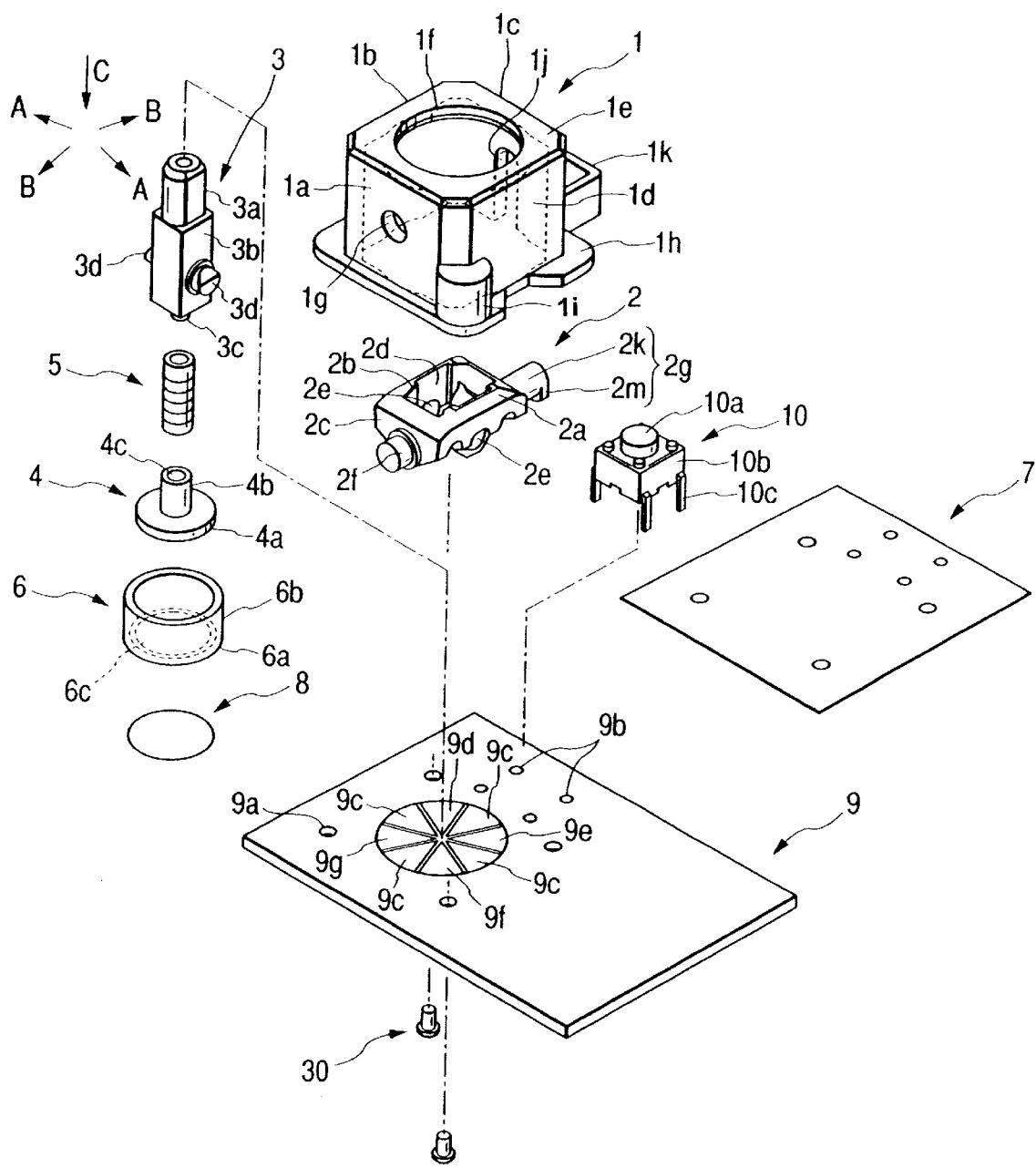
FIG. 1 is an exploded perspective view of a multidirectional input device embodying the present invention.

FIG. 1 is an exploded perspective view of a multidirectional input device embodying the present invention. As shown in the same figure, the multidirectional input device of this embodiment includes a frame 1 formed by molding a synthetic resin material for example. The frame 1 has side walls 1a, 1b, 1c and 1d which define a hollow interior, and a lower portion of the frame is open. An external form of the frame 1 is generally in the shape of a rectangular parallelepiped. An upper portion of the frame 1 is closed with an upper wall 1e and an operating hole 1f is formed centrally of the upper wall 1e. Flange portions 1h are formed at open ends of the side walls 1a, 1b, 1c and 1d, and generally semi-cylindrical holding portions 1i are formed at a pair of opposed corners of the frame 1. Tapped holes (not shown) are formed in lower positions of the holding portions 1i.

A circular hole 1g is formed nearly centrally of the side wall 1a, while in the side wall 1c opposed to the side wall 1a is formed a generally semi-circular support portion 1j in a position opposed to the circular hole 1g. In this case, the circular hole 1g in the side wall 1a and the generally semi-circular support portion 1j in the side wall 1c ate formed in such a manner that a line joining the center of the circular hole 1g and that of the semi-circle of the support portion 1j is parallel to the upper wall 1e.

A mounting portion 1k, which is a U-shaped through portion, extends outwards from the right and left sides in the figure of the support portion 1j formed in the side wall 1c.

An interlocking member 2 is formed by molding a synthetic resin material for example and is provided nearly centrally with a support portion 2a which is generally rectangular in external form. The support portion 2a is surrounded by longitudinal and transverse side walls 2b, 2c, and in the inside surrounded by the side walls 2b and 2c is formed a generally rectangular slot 2d as a through hole.

A pair of circular holes 2e are formed respectively in lower central positions of the longitudinal sidewalls 2b, and first and second arm portions 2f, 2g extend horizontally to the left and right sides respectively from the transverse side walls 2c. The second arm portion 2g extending to one side is formed with a support portion 2k having a predetermined diameter, and a generally cylindrical protrusion 2m is projected from the support portion 2k.

The first arm portion 2f is inserted into the circular hole 1g of the side wall 1a and the second arm portion 2g is fitted in the support portion 1j. The interlocking member 2 is bridgewise mounted rotatably in the interior of the frame 1.

An operating shaft 3, which is formed by molding a synthetic resin material, has an oval-shaped knob portion 3a and a portion 3b which is prismatic in external form and which is extended below the knob portion 3a in the figure. The prismatic portion 3b is integrally formed with a receptacle portion (not shown) having a circular hollow interior. The prismatic portion 3b is open on its lower side and is surrounded with flat outer walls.

In the interior of the receptacle portion (not shown) is integrally formed a shaft portion 3c which extends downward in the figure in alignment with the knob portion 3a. A lower end of the shaft portion 3c projects a predetermined amount downward from the receptacle portion (not shown).

On a pair of opposed flat outer wall surfaces of the prismatic portion 3b are respectively formed generally semi-circular pivot portions 3d projecting convexly toward the knob portion 3a.

The knob portion 3a of the operating shaft 3 is inserted into the slot 2d of the interlocking member 2 so that the knob portion and the prismatic portion 3b can move along the slot 2d. In this state, the pivot portions 3d of the operating shaft 3 are positioned within the circular holes 2e of the interlocking member 2.

The operating shaft 3 can tilt in arrow A—A directions (directions intersecting the longitudinal direction of the slot 2d), i.e., in rotating directions centered on the longitudinal direction of the interlocking member 2, and also in arrow B—B directions (the longitudinal direction of the slot 2d), i.e., in directions parallel to the slot 2d of the interlocking member 2. The operating shaft 3 is tiltable not only in such arrow A—A and B—B directions but also in any other directions.

A tilt center of the operating shaft corresponds to an intersecting point between a rotational center of the pivot portions 3d and that of the first and second arm portions 2f, 2g of the interlocking member 2.

A return spring 5 is constituted by a coiled spring having upper and lower coil ends and having a predetermined biasing force. The return spring 5 is fitted on the shaft portion 3c of the operating shaft 3 and is positioned within the receptacle portion (not shown).

An operating member 4 is formed by molding a synthetic resin material and is provided on one end side (lower side)

thereof with a base portion 4a, the base portion 4a having a disc-like external shape and a flat bottom whose peripheral edge is chamfered to give a predetermined radius R. Centrally of the base portion 4a is formed a cylindrical boss portion 4b projecting outwards, with an axial bore 4c being formed centrally of the boss portion 4b.

The lower end of the shaft portion 3c of the operating shaft 3 is inserted into the axial bore 4c of the operating member 4 and the boss portion 4b of the operating member is inserted movably into the receptacle portion (not shown) in the prismatic portion 3b. In this state, the axis of the operating shaft 3 and that of the axial bore 4c of the operating member 4 are in alignment with each-other.

The return spring 5 is fitted on the shaft portion 3c and its upper and lower coil ends are brought into elastic contact respectively with a ceiling surface of the receptacle portion (not shown) in the prismatic portion 3b and an upper surface of the boss portion 4b of the operating member 4. One end (upper coil end) on the knob portion 3a side of the return spring 5 is guided by an inner wall of the prismatic portion 3b, while the opposite end (lower coil end) of the return spring 5 is guided by the upper surface of the boss portion 4b. Thus, longitudinal and transverse motions of the return spring 5 are restricted.

A slide member 6, which is formed by molding a synthetic resin material, comprises a circular holding portion 6a, a cylindrical side wall 6b erected upright from a peripheral edge of the holding portion 6a, and a circular recess 6c formed in a lower surface of the holding portion 6a.

Inside the side wall 6b of the slide member 6 is received the operating member 4 and the base portion 4a of the operating member is put in elastic contact with an upper surface of the holding portion 6a.

An insulating film 7 is formed in a generally rectangular film shape using an insulating material and has predetermined dielectric constant and thickness.

A movable electrode portion 8 is formed in a disc shape by press working with use of a metallic material and is fixed to the recess 6c of the slide member 6 using an adhesive for example.

On a printed wiring board 9, which is generally rectangular, are formed plural (e.g., four) tapped holes 9a in predetermined positions, plural (e.g., four) terminal holes 9b, plural (e.g., four) sectorial earth electrodes 9c surrounded by the tapped holes 9a, and plural (e.g., four) sectorial first, second, third and fourth fixed electrodes 9d, 9e, 9f, 9g each disposed between adjacent earth electrodes 9c. In other words, the first, second, third and fourth fixed electrodes 9d, 9e, 9f, 9g are arranged crosswise and the earth electrodes 9c are also arranged crosswise so that each of them is positioned between adjacent fixed electrodes, affording a circular shape as a whole.

The earth electrodes 9c and the first, second, third and fourth fixed electrodes 9d, 9e, 9f, 9g are formed as patterns using a metallic conductor by etching as in the formation of a wiring pattern (not shown) on the printed wiring board 9.

The earth electrodes 9a and the first, second, third and fourth electrodes 9d, 9e, 9f, 9g constitute a fixed electrode portion as a whole.

On the printed wiring board 9, the insulating film 7 is disposed on each of the earth electrodes 9c and the first, second, third and fourth fixed electrodes 9d, 9e, 9f, 9g.

The printed wiring board 9 with the insulating film 7 put thereon is disposed so as to close a lower portion of the frame 1. That is, the insulating film 7 is sandwiched between the printed wiring board 9 and the lower portion of the frame 1.

At the same time, the slide member 6 is brought into elastic contact with a surface of the insulating film 7 on the printed wiring board 9 through the operating member 4 under the action of the biasing force of the return spring 5. In this state, the movable electrode portion 8 affixed to the slide member 6 is opposed to the earth electrodes 9c and the first, second, third and fourth fixed electrodes 9d, 9e, 9f, 9g through the insulating film 7. Thus, what is called a variable condenser is constituted by the fixed electrode portion and the movable electrode portion 8.

The printed wiring board 9 and frame 1 are rendered integral with each other using screws 30.

A push-button switch 10 as an electric part, which is mounted to the mounting portion 1k of the frame 1, is formed with a stem portion 10a capable of turning ON and OFF an internal switch circuit (not shown), a case 10b which hermetically seals the internal switch circuit., and plural (e.g., four) mounting terminals 10c extending downwards from side faces of the case 10b.

The push-button switch 10 is put on the printed wiring board 9 and its mounting terminals 10c are projected outwards through the terminal holes 9b formed in the printed wiring board and are soldered.

The protrusion 2m of the second arm portion 2g of the interlocking member 2 is positioned on the stem portion 10a of the push-button switch 10.

The following description is now provided about the operation of the multidirectional input device of this embodiment.

With no load applied to the knob portion 3a of the operating shaft 3, as shown in FIG. 1, the slide member 6 is kept in elastic contact with the surface of the printed wiring board 9 through the operating member 4 and further through the insulating film 7 under the action of the biasing force of the return spring 5, further, the base portion 4a of the operating member 4 assumes a horizontal state and the operating shaft 3 is upright (vertical) with respect to the printed wiring board 9, that is, the shaft 3 is in a neutral state.

With the operating shaft 3 in this vertical position, the first, second, third and fourth fixed electrodes 9d, 9e, 9f and 9g are opposed to the movable electrode portion 8 at an equal opposition area.

In this state, capacitances between the first fixed electrode 9d and the movable electrode portion 8, between the second fixed electrode 9e and the movable electrode portion 8, between the third fixed electrode 9f and the movable electrode portion 8, and between the fourth fixed electrode 9g and the movable electrode portion 8, are detected respectively through the earth electrodes 9c opposed to the movable electrode portion 8.

In this state, moreover, capacitance values between the first fixed electrode 9d and the movable electrode portion 8, between the second fixed electrode 9e and the movable electrode portion 8, between the third fixed electrode 9f and the movable electrode portion 8, and between the fourth fixed electrode 9g and the movable electrode portion 8, are maintained almost equal.

If an operating force acting in arrow B direction parallel to the slot 2d of the interlocking member 2 is applied to the knob portion 3a of the operating shaft 3 which is in the neutral state, causing the operating shaft 3 to tilt, the operating shaft turns about the pivot portions 3d and the bottom of the base portion 4a of the operating member 4 moves in sliding contact with the upper surface of the holding portion 6a of the slide member 6. With this sliding movement of the base portion 4a, the peripheral edge of the base portion comes into abutment against the side wall 6b of the slide member 6 and the slide member moves on the insulating film 7 in sliding contact and parallel with the printed wiring board 9, so that the operating member 4 tilts. In this state, part of the outer peripheral edge of the base portion 4a of the operating member 4 is brought into elastic contact with the upper surface of the holding portion 6a.

When the operating shaft 3 is tilted, the slide member 6 slides on the insulating film 7 and the movable electrode portion 8 fixed to the slide member 6 slides on the insulating film 7 in parallel with the printed wiring board 9, thereby causing changes in capacitance values between the first fixed electrode 9d and the movable electrode portion 8, between the second fixed electrode 9e and the movable electrode portion 8, between the third fixed electrode 9f and the movable electrode portion 8, and between the fourth fixed electrode and the movable electrode portion 8. For example, capacitance values between the first and second fixed electrodes 9d, 9e and the movable electrode portion 8 increase, while capacitance values between the third and fourth fixed electrodes 9f, 9g and the movable electrode portion 8 decrease. By calculating such capacitance values there are detected direction and speed of the tilting motion of the operating shaft 3.

Upon release of the operating force imposed on the operating shaft 3, the operating shaft reverts to the original neutral state with the biasing force of the return spring 5 because the compression rate of the return spring in this state is higher than that in the upright neutral state of the operating shaft 3. With this operation, for example, capacitance values between the first, second, third, fourth fixed electrodes 9d, 9e, 9f, 9g and the movable electrode portion 8 all become equal as in the original state.

If an operating force acting in the direction of arrow A orthogonal to the slot 2d of the interlocking member 2 is applied to the operating shaft 3 which is in a neutral state, causing the operating shaft to tilt, the interlocking member 2 rotates. With this rotation of the interlocking member 2, the movable electrode portion 8 moves in parallel with the printed wiring board 9, causing changes in capacitance values in the same way as that described above. Then, the capacitance values are calculated to detect the direction and speed of the tilting motion of the operating shaft 3.

Although the movable electrode portion 8 moves to afford capacitance values with tilting motions of the operating shaft 3 in arrow A and B directions, tilting directions of the operating shaft are not limited to such arrow A and B directions, but may be arbitrary directions. Even with the operating shaft 3 tilted in any other directions than the arrow A and B directions, the movable electrode portion 8 is moved and capacitance values are obtained.

More specifically, changes in capacitance values between the first, second, third, fourth fixed electrodes 9d, 9e, 9f, 9g and the movable electrode portion 8 are detected and calculated (for example, added and subtracted), then tilting directions and speed of the operating shaft 3 are derived from the results of the calculation, thereby operating a cursor for example.

The push-button switch 10 is operated in the following manner. The operating shaft 3, which is in such a neutral state as shown in FIG. 1, is pushed by applying thereto a downward load in the direction of arrow C. As a result, the operating shaft 3 is moved downward and the second arm portion 2g located within the generally semi-circular support portion 1j formed in the side wall 1c of the frame 1 moves downward with the first arm portion 2f of the interlocking member 2 as fulcrum which arm portion 2f is inserted into the circular hole 1g formed in the side wall 1a of the frame 1. Consequently, the protrusion 2m formed at one end of the support portion 2k and projecting outwards from the support portion 1j of the frame 1 pushes the stem portion 10a of the push-button switch 10. In this way the push-button switch 10 can be turned ON and OFF.

The operating shaft 3 can be depressed in the arrow C direction not only in its neutral state but also when the capacitance values between the first, second, third, fourth fixed electrodes 9d, 9e, 9f, 9g and the movable electrode portion 8 have become predetermined certain values by tilting the operating shaft 3.

Next, a detailed description will be given below about calculating capacitance values between the movable electrode portion and the fixed electrodes obtained by operation of the operating shaft in the multidirectional input device of this embodiment.

Figure 2:
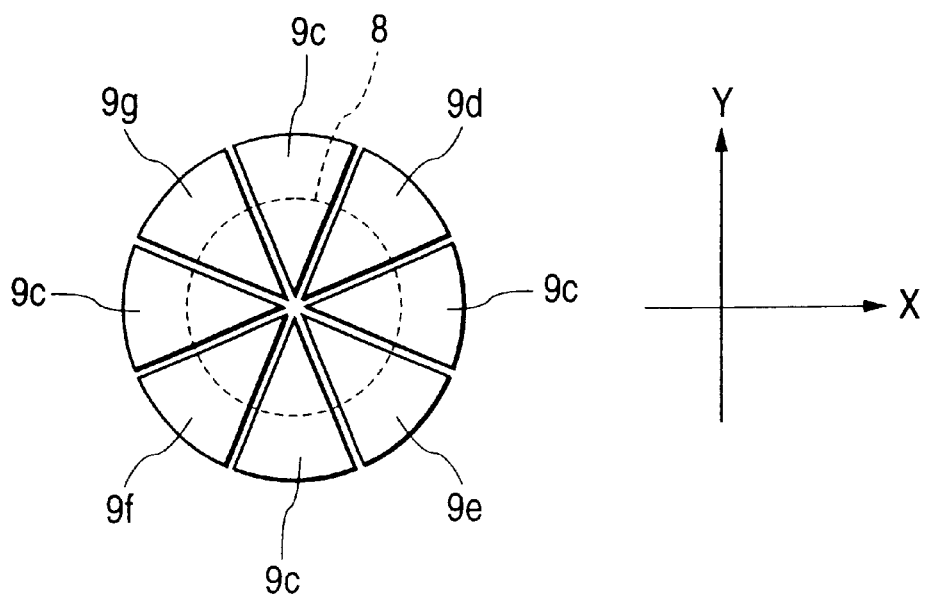
FIG. 2 is a first explanatory diagram explaining how to detect capacitance values in the multidirectional input device.
Figure 3:
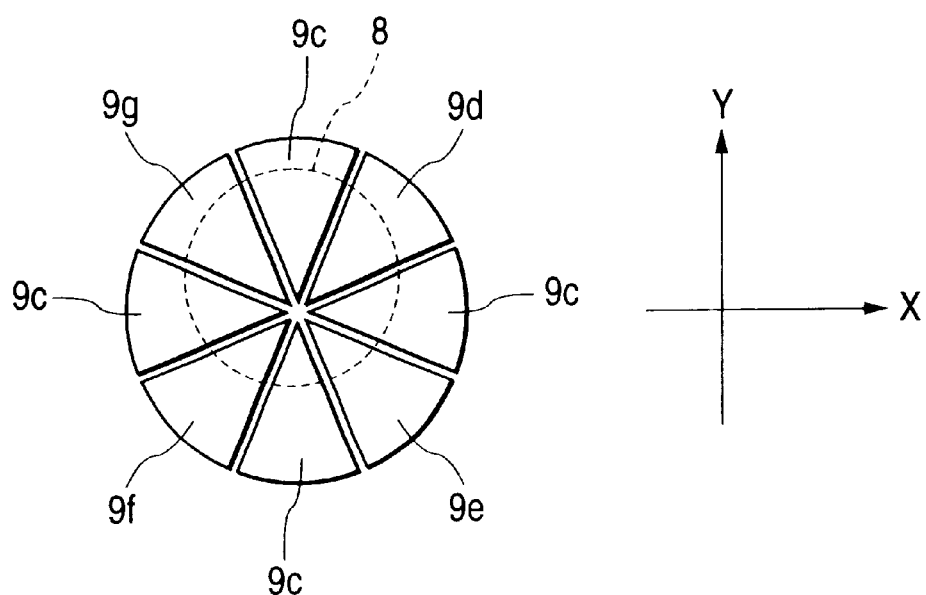
FIG. 3 is a second explanatory diagram explaining how to detect capacitance values in the multidirectional input device.

FIG. 2 is a first explanatory diagram on the calculation of capacitance values in the multidirectional input device of this embodiment and FIG. 3 is a second explanatory diagram on the calculation.

First, as shown in FIG. 2, when the operating shaft is upright with respect to the printed wiring board 9, the center of the circular, first, second, third and fourth fixed electrodes 9d, 9e, 9f, 9g and that of the movable electrode portion 8 are aligned with each other. Given that the capacitance value between the first fixed electrode 9d and the movable electrode portion 8 is A, the capacitance value between the second fixed electrode 9e and the movable electrode portion 8 is B, the capacitance value between the third fixed electrode 9f and the movable electrode portion 8 is C, and the capacitance value between the fourth fixed electrode 9g and the movable electrode portion 8 is D, then, for example, (A+B)−(C+D)=0 which is a displacement calculation in X direction and (A+D)−(B+C)=0 which is a displacement calculation in Y direction, and from these calculations it turns out that the operating shaft (see FIG. 1) is upright with respect to the printed wiring board 9.

Next, if the upright operating shaft 3 is tilted in −(minus) Y direction, the movable electrode portion 8 moves in +(plus) Y direction on the fixed electrodes of the printed wiring board 9. If in this state the capacitance values A, B, C and D are detected and calculated, (A+B)−(C+D)=0 which is a displacement calculation in X direction and (A+D)−(B+C)>0 which is a displacement calculation in Y direction, and from these calculations it turns out that the operating shaft 3 is tilted in −(minus) Y direction with respect to the printed wiring board 9.

Thus, a displacement in X direction of the operating shaft 3 is calculated by the calculation (A+B)−(C+D) of the capacitance values A, B, C and D, a displacement in Y direction of the operating shaft is calculated by the calculation (A+D)−(B+C), and from the thus-calculated values there is calculated a tilting of the operating shaft in X-Y directions.

Although in the multidirectional input device of this embodiment the fixed electrode portion is composed of the first, second, third and fourth fixed electrodes 9d, 9e, 9f, 9g and four earth electrodes 9c, this constitutes no limitation. For example, the fixed electrode portion may be constituted by only one first fixed electrode formed in a predetermined shape or by one first fixed electrode formed in a predetermined shape and one earth electrode.

Although in the multidirectional input device of this embodiment an insulating film is put on the fixed electrode portion of the printed wiring board this constitutes no limitation, but an insulating film may be formed on the fixed electrode portion directly by printing for example.

Next, a multidirectional input device according to the second embodiment of the present invention will be described below with reference to the drawings.

Figure 4:
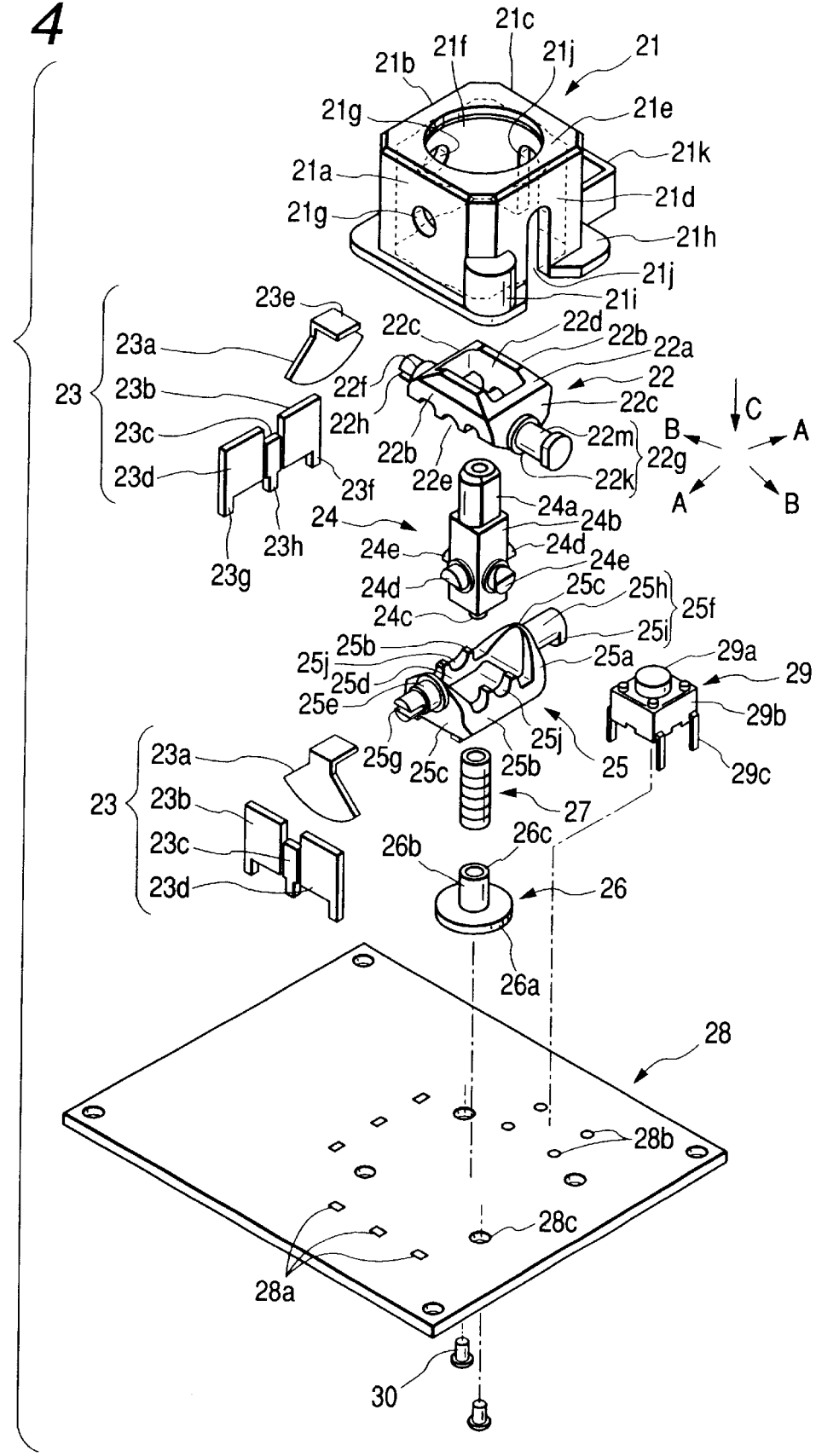
FIG. 4 is an exploded perspective view of a multidirectional input device embodying the present invention.
Figure 5:
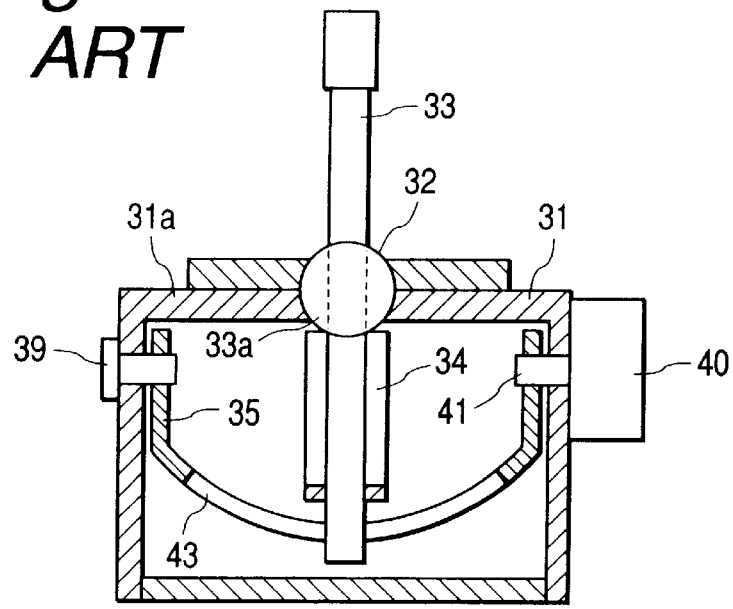
FIG. 5 is a longitudinal sectional view of a conventional multidirectional input device.
Figure 6:
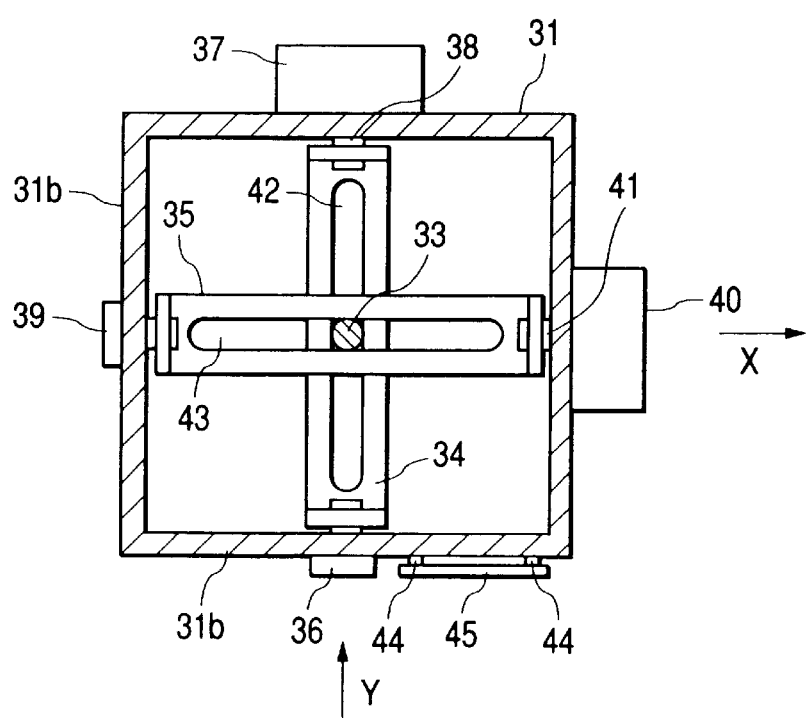
FIG. 6 is a transverse sectional view thereof.

FIG. 4 is an exploded perspective view of a multidirectional input device embodying the present invention.

As shown in FIG. 4, the multidirectional input device of this embodiment includes a frame 21 which is formed by molding a synthetic resin material for example. The frame 21 as side walls 21a, 21b, 21c and 21d which define a hollow interior, and a lower portion of the frame is open. An external form of the frame 21 is generally in the shape of a rectangular parallelepiped. An upper portion of the frame 21 is closed with an upper wall 21e and an operating hole 21f is formed centrally of the upper wall 21e. Flange portions 21h are formed at open ends of the side walls 21a, 21b, 21c and 21d, and generally semi-cylindrical holding portions 21i are formed at a pair of opposed corners of the frame 21. Tapped holes (not shown) are formed in lower positions of the holding portions 21i.

Circular holes 21g are formed in two adjacent side walls 21a and 21b respectively, while generally semi-circular support portions 21j are formed in two adjacent side walls 21c and 21d respectively in positions opposed to the circular holes 21g. Further, a mounting portion 21k, which is a U-shaped through portion, extends outwards from the right and left sides in the figure of the support portion 21j formed in the side wall 21c.

In this case, a line joining the center of the circular hole 21g formed in the side wall 21a and that of the semi-circle of the generally semi-circular support portion 21j formed in the side wall 21c and a line joining the center of the circular hole 21g formed in the side wall 21b and that of the generally semi-circular support portion 21j formed in the side wall 21d intersect each other perpendicularly so as to have a point of intersection.

A variable condenser 23 as an electric part, which is formed by press working with use of a metallic plate for example, comprises a generally sectorial movable electrode portion 23a, a pair of generally rectangular first and second fixed electrodes 23b, 23d spaced a predetermined distance from and opposed to the movable electrode portion 23a, and a generally rectangular earth electrode 23c sandwiched between the first and second fixed electrodes 23b, 23d and opposed to the movable electrode portion 23a. In other words, the paired first and second fixed electrodes 23b, 23d are disposed on both sides of the earth electrode 23c.

A fixed electrode portion is constituted by the first and second fixed electrodes 23b, 23d and the earth electrode 23c.

The movable electrode portion 23a has a mounting portion 23e as a base portion of the sectorial shape. The first and second fixed electrodes 23b, 23d have terminal portions 23f and 23g respectively, and the earth electrode 23c has a terminal portion 23h.

As the movable electrode portion 23a is driven and moves, an opposition area between the movable electrode portion 23a and each of the paired first and second fixed electrodes 23b, 23d is changed.

A first interlocking member 22 is formed by molding a synthetic resin material for example and is provided nearly centrally with a support portion 22a which is generally rectangular in external form. The support portion 22a is surrounded with longitudinal and transverse side walls 22b, 22c, and in the inside surrounded with the side walls 22b and 22c is formed a generally rectangular first slot 22d as a through hole.

A pair of semi-circular recesses 22e are formed respectively in lower central positions of the longitudinal side walls 22b, and first and second arm portions 22f, 22g extend horizontally to the left and right sides respectively from the transverse side walls 22c. A slit 22h is formed in an outer end of the first arm portion 22f extending to one side.

The second arm portion 22g extending to the opposite side is formed with a support portion 22k having a predetermined diameter, and a generally cylindrical protrusion 22m is projected from the support portion 22k.

The first arm portion 22f is inserted into the circular hole 21g formed in the side wall 21b and projects outward from the hole 21g, and the mounting portion 23e of the movable-electrode portion 23a is press-fitted into the slit 22h and is fixed thereby.

An operating shaft 24, which is formed by molding a synthetic resin material, has an oval-shaped knob portion 24a and a portion 24b which is prismatic in external form and which is extended below the knob portion 24a in the figure. The prismatic portion 24b is integrally formed with a receptacle portion (not shown) having a circular hollow interior. The prismatic portion 24b is open on its lower side and is surrounded with flat outer walls.

In the interior of the receptacle portion (not shown) is integrally formed a shaft portion 24c which extends downward in the figure in alignment with the knob portion 24a. A lower end of the shaft portion 24c projects a predetermined amount downward from the receptacle portion (not shown).

On a first pair of opposed flat outer wall surfaces of the prismatic portion 24b are respectively formed generally semi-circular, first pivot portions 24d projecting convexly toward the knob portion 24a. Likewise, on a second pair of opposed flat outer wall surfaces of the prismatic portion 24b are respectively formed generally semi-circular, second pivot portions 24e projecting convexly toward the side opposite to the knob portion 24a.

The knob portion 24a of the operating shaft 24 is inserted into the first slot 22d of the first interlocking member 22 so that the knob portion and the prismatic portion 24b can move along the first slot 22d.

The operating shaft 24 can tilt in arrow A—A directions, i.e., in directions in which the first interlocking member 22 is rotated, and also in arrow B—B directions, i.e., in directions parallel to the first slot 22d of the first interlocking member 22. The operating shaft 24 is tiltable not only in such arrow A—A and B—B directions but also in any other directions.

A tilt center of the operating shaft 24 corresponds to an intersecting point between a rotational center of the first pivot portions 24d and that of the second pivot portions 24e.

A return spring 27 is constituted by a coiled spring having upper and lower coil ends and having a predetermined biasing force. The return spring 27 is fitted on the shaft portion 24c of the operating shaft 24 and is positioned within the receptacle portion (not shown).

A second interlocking member 25 is formed by molding a synthetic resin material for example and is disposed below and perpendicularly to the first interlocking member 22.

The second interlocking member 25 is provided nearly centrally with a support portion 25a which is generally rectangular in external form. The support portion 25a is surrounded with longitudinal and transverse side walls 25*b*, 25*c*, and in the inside surrounded with the side walls 25*b* and 25*c* is formed a generally rectangular, second slot 25*d* as a through hole.

Recesses 25*j* which permit the second pivot portions 24*e* of the operating shaft 24 to be rested thereon are formed each in a semi-circular shape of a predetermined radius and respectively in upper central positions of the longitudinal side walls 25*b*. First and second arm portions 25*e*, 25*f* extend horizontally to the left and right sides respectively from the transverse side walls 25*c*. Further, a slit 25*g* is formed in an outer end of the first arm portion 25*e* extending to one side.

The second arm portion 25*f* extending to the opposite side is formed with a projecting portion 25*h*, and a protrusion 25*i* is formed on an outer end of the projecting portion 25*h*.

The first arm portion 25*e* of the second interlocking member 25 is inserted into the circular hole 21*g* formed in the side wall 21*a* of the frame 21 and is supported rotatably thereby. The second arm portion 25*f* is positioned within the semi-circular support portion 21*j* formed in the side wall 21*c*. The second interlocking member 25 is disposed within the frame 21 rotatably and so that the protrusion 25*i* as one end portion thereof can move up and down.

In this state, the slit 25*g* of the first arm portion 25*e* is projected outwards from the side wall 21*a*.

The mounting portion 23*e* of the movable electrode portion 23*a* is press-fitted into the slit 25*g* and is fixed thereby.

In this state, the first and second interlocking members 22, 25 are mounted bridgewise within the frame 21 so that the respective rotational axes are orthogonal to each-other so as to have an intersecting point and so that the intersecting point, when both interlocking members are rotated, is aligned with the tilt center of the operating shaft 24. At this time, the second pivot portions 24*e* of the operating shaft 24 are brought into abutment rotatably against the recesses 25*j* of the second interlocking member 25, while the first pivot portions 24*d* are brought into abutment rotatably against the recesses 22*e* of the first interlocking member 22.

An operating member 26 is formed by molding a synthetic resin material and is provided on one end side (lower side) thereof with a base portion 26*a*, the base portion 26*a* having a disc-like external shape and a flat bottom whose peripheral edge is chamfered to give a predetermined radius R. Centrally of the base portion 26*a* is formed a cylindrical boss portion 26*b* projecting outwards, with an axial bore 26*c* being formed centrally of the boss portion 26*b*.

The shaft portion 24*c* of the operating shaft 24 is inserted into the axial bore 26*c* of the operating member 26 and the boss portion 26*b* of the operating member is inserted movably into the receptacle portion (not shown) in the prismatic portion 24*b*. In this state, the axis of the operating shaft 24 and that of the axial bore 26*c* of the operating member 26 are in alignment with each other.

The return spring 27 is fitted on the shaft portion 24*c* and its upper and lower coil ends are brought into elastic contact respectively with a ceiling surface of the receptacle portion (not shown) in the prismatic portion 24*b* and an upper surface of the boss portion 26*b* of the operating member 26. One end (upper coil end) on the knob portion 24*a* side of the return spring 27 is guided by an inner wall-of the prismatic portion 24*b*, whereby longitudinal and transverse motions of the return spring 27 are restricted.

A bottom board 28 is formed in a generally rectangular external shape using an insulating material. Angular holes 28*a*, three of which constitute one set, four terminal holes 28*b*, and plural tapped holes 28*c* are formed in plural positions of the bottom board 28.

The bottom board 28 is disposed so as to close a lower portion of the frame 21. In this state, the base portion 26*a* of the operating member 26 is put in elastic contact with one side of the bottom board 28 under the biasing force of the return spring 27.

The terminal portions 23*f* and 23*g* of the first and second fixed electrodes 23*b*, 23*d* and the terminal portions 23*h* of the earth electrodes 23*c* are inserted into the angular holes 28*a* formed in the bottom board 28 and the electrodes 23*b*, 23*d* and 23*c* are fixed to the bottom board 28 by soldering. The bottom board 28 is constituted by a printed wiring board.

The bottom board 28, i.e., a printed wiring board, and the frame 21 are rendered integral with each other, using screws 30.

A push-button switch 29 as an electric part, which is mounted to the mounting portion 21*k* of the frame 21, is formed with a stem portion 29*a* capable of turning ON and OFF an internal switch circuit (not shown), a case 29*b* which hermetically seals the internal switch circuit, and plural (e.g., four) mounting terminals 29*c* extending downwards from side faces of the case 29*b*.

The push-button switch 29 is put on the bottom board 28 and its mounting terminals 29*c* are projected outwards through the terminal holes 28*b* formed in the bottom board 28, i.e., a printed wiring board.

The protrusion 25*i* of the second arm portion 25*f* is positioned on the stem portion 29*a* of the push-button switch 29.

Next, a description will be given below about the operation of the multidirectional input device of this embodiment.

With no load applied to the knob portion 24*a* of the operating shaft 24, as shown in FIG. 4, the base portion 26*a* of the operating member 26 is brought into elastic contact with the surface of the printed wiring board as the bottom board 28 under the action of the biasing force of the return spring 27, the base portion 26*a* assumes a horizontal state and the operating shaft 24 is upright relative to the bottom plate 28, that is, assumes a neutral state.

With the operating shaft 24 in this vertical position, the first and second fixed electrodes 23*b*, 23*d* are opposed to the movable electrode portion 23*a* at an equal opposition area, in each variable condenser. In this state, capacitances between the first fixed electrode 23*b* and the movable electrode portion 23*a* and between the second fixed electrode 23*d* and the movable electrode portion 23*a* are detected through the earth electrode 23*c* opposed to the variable electrode portion 23*a*.

In this state, moreover, the capacitance value between the first fixed electrode 23*b* and the movable electrode portion 23*a* and the capacitance value between the second fixed electrode 23*d* and the movable electrode portion 23*a* are maintained equal.

If an operating force acting in arrow B direction parallel to the first slot 22*d* of the first interlocking member 22 is applied to the knob portion 24*a* of the operating shaft 24 which is in the neutral state, causing the operating shaft 24 to tilt, the second interlocking member 25 turns about the first and second arm portions 25*e*, 25*f*. At the same time, the operating shaft 24 rotates, the bottom of the base portion 26*a* of the operating member 26 moves in sliding contact with the upper surface of the bottom board, a part on the outer periphery side of the base portion 26a is positioned on the bottom board 28, and the operating member 26 tilts.

In this state, a part on the outer peripheral edge side of the base portion 26a of the operating member 26 is brought into elastic contact with the upper surface of the bottom board 28 under the action of the biasing force of the return spring 27.

When the operating shaft 24 is tilted to rotate the second interlocking member 25, the movable electrode portion 23a press-fitted and engaged into the first arm portion 25e rotates and the capacitance value of the variable condenser 23 changes. That is, the capacitance value between the first fixed electrode 23b and the movable electrode portion 23a and the capacitance value between the second fixed electrode 23d and the movable electrode portion 22a each undergo a change. For example, the former capacitance value increases and the latter decreases. By calculating the capacitance values there are detected tilting direction and speed of the operating shaft 24.

When the operation of the variable condenser 22 installed near the outside of the side wall 21a of the frame 21 is over and the operating force which has been applied to the operating shaft 24 is released, the operating shaft 24 reverts to its original neutral state with the biasing force of the return spring 27 because the compression rate of the return spring in this state is higher than that of the return spring obtained when the operating shaft is in its upright, neutral state. At this time, for example the capacitance value between the first fixed electrode 23b and the movable electrode portion 23a decreases, while the capacitance value between the second fixed electrode 23d and the movable electrode portion 23a increases.

When an operating force acting in arrow A direction orthogonal to the first slot 22d of the first interlocking member 22 is applied to the operating shaft 24 which is in a neutral state, causing the operating shaft to tilt, the first interlocking member 22 rotates, resulting in that the movable electrode portion 23a rotates and the capacitance value of the variable condenser 23 changes.

When the operation of the variable condenser 23 installed on the outside of the side wall 21c is over and the operating force which has been applied to the operating shaft 24 is released, the operating shaft, like the foregoing, reverts to its original neutral state with the biasing force of the return spring 27 because the compression rate of the return spring in this state is higher than that obtained when the operating shaft 24 is in its upright (vertical), neutral state.

Thus, the variable condensers 23 are operated by tilting in arrow A and B directions of the operating shaft 24 to afford capacitance values, but tilting directions of the operating shaft are not limited to such arrow A and B directions, but may be arbitrary directions. Even with the operating shaft 24 tilted in any other directions than the arrow A and B directions, the variable condensers 23 are operated to afford capacitance values.

To be more specific, changes in capacitance values between the first fixed electrode 23b and the movable electrode portion 23a and between the second fixed electrode 23d and the movable electrode portion 23a are detected and calculated (for example, subjected to subtraction), then tilting directions and speed of the operating shaft 24 are derived from the results of the calculation, thereby operating a cursor for example.

The push-button switch 29 is operated in the following manner. The operating shaft 24, which is in such a neutral state as shown in FIG. 4, is pushed by applying thereto a downward load in the direction of arrow C. As a result, the operating shaft 24 is moved downward and the second arm portion 25f located within the generally semi-circular support portion 21j formed in the side wall 21c of the frame 21 moves downward with the first arm portion 25e of the second interlocking member 25 as fulcrum which arm portion 25e is inserted into the circular hole 21g formed in the side wall 21a of the frame 21. Consequently, the protrusion 25i formed at one end of the projecting portion 25h of the second interlocking member 25 and projecting outwards from the support portion 21j of the frame 21 pushes the stem portion 29a of the push-button switch 29. In this way the push-button switch 29 can be turned ON and OFF.

The operating shaft 24 can be depressed in the arrow C direction not only in its neutral state but also when the capacitance value of the variable condenser 23 has become a predetermined certain value by tilting the operating shaft 24.

Although in this embodiment the fixed electrode portion is composed of the first and second fixed electrodes 23b, 23d and the earth electrode 23c, this constitutes no limitation. For example, the fixed electrode portion may be constituted by only a pair of first and second fixed electrodes, and the fixed electrodes may be switched from one to the other so that when detecting the capacitance between one fixed electrode and the movable electrode portion, the other fixed electrode is regarded as an earth electrode.

It goes without saying that the fixed electrode portion may be constituted by only the first fixed electrode or by both the first fixed electrode and the earth electrode.

Although in this embodiment the operating shaft 24 and the bottom board 28 are formed using a synthetic resin material, they may be formed using a metallic material such as a die casting alloy from the standpoint of ensuring a high strength and preventing wear caused by expiration of the service life.

In the multidirectional input device according to the present invention, as described above, a printed wiring board having a fixed electrode portion is provided, a movable electrode portion is attached to an operating shaft in opposition to the fixed electrode portion and is moved by operation of the operating shaft to change an opposition area between the movable electrode portion and the fixed electrode portion, then a change in capacitance between both electrode portions is detected, thereby obtaining an operational direction of the operating shaft. Thus, the capacitance between the movable electrode portion and the fixed electrode portion is changed by moving the movable electrode portion attached to the operating shaft and this change may be detected. Therefore, the movable electrode portion disposed on the operating shaft side and the fixed electrode portion disposed on the printed wiring board can be opposed to each other easily; besides, the number of parts used is small, thus permitting the provision of a less expensive multidirectional input device.

In the multidirectional input device according to the present invention, a single interlocking member having a slot is mounted bridgewise within a frame, and an operating shaft is inserted into the slot and is supported by the interlocking member, the operating shaft being tilted in the longitudinal direction of the slot and also in a direction orthogonal thereto. Since the operating shaft is supported by a single interlocking member mounted bridgewise within the frame, it can be supported easily, that is, a simple construction will do, leading to the reduction of cost of the multidirectional input device.

In the multidirectional input device according to the present invention, a slide member is disposed so that it can be moved along the surface of a printed wiring board by a tilting motion of the operating shaft, and a movable electrode portion is fixed to the slide member and is moved in parallel with the fixed electrode portion by a tilting motion of the operating shaft. Because the movement of the movable electrode portion is parallel to the fixed electrode portion, there is exhibited a stable change in the capacitance between both electrode portions, which change can be detected easily, thus permitting the provision of a multidirectional input device superior in operability.

In the multidirectional input device according to the present invention, the fixed electrode portion is formed by a conductor pattern on the surface of the printed wiring board, so the formation of the fixed electrode portion can be done simultaneously with the formation of a wiring pattern on the printed wiring board and is thus easy. Thus, the multidirectional input device can be provided less expensively.

In the multidirectional input device according to the present invention, the fixed electrode portion has an earth electrode and a first fixed electrode adjacent to the earth electrode, both the earth electrode and the first fixed electrode being opposed to the movable electrode portion, and a change in capacitance between the fixed electrode portion and the movable electrode portion is detected through the earth electrode opposed to the movable electrode portion. According to this configuration, an electric circuit is formed by the first electrode, the movable electrode portion and the earth electrode, so that wiring of the movable electrode portion is no longer necessary, that is, the layout of electrodes becomes easier, and the manufacturing cost of the multidirectional input device is reduced.

In the multidirectional input device according to the present invention, the fixed electrode portion is formed in a generally circular shape by earth electrodes and first to fourth fixed electrodes, the earth electrodes and the first to fourth electrodes being opposed to the movable electrode portion which is formed in a circular shape, changes in capacitance between each of the first to fourth fixed electrodes and the movable electrode portion caused by movement of the movable electrode portion are detected through the earth electrodes opposed to the movable electrode portion. Thus, since the circular fixed electrode portion composed of the earth electrodes and the first to fourth fixed electrodes and the movable electrode portion are opposed to each other and changes in capacitance caused by movement of the movable electrode portion are detected, stable capacitance changes can be detected no matter in which direction the movable electrode portion may move, that is, no matter in which direction the operating shaft with the movable electrode portion attached thereto may tilt. Thus, the tilting direction of the operating shaft can be detected easily.

In the multidirectional input device according to the present invention, since an insulating film is disposed between the movable electrode portion and the fixed electrode portion and the movable electrode portion slides on the insulating film, the sliding motion of the movable electrode portion becomes smooth and hence there can be attained a satisfactory operability of the operating shaft with the movable electrode portion attached thereto.

In the multidirectional input device according to the present invention, since the insulating film is sandwiched between the printed wiring board and the lower portion of the frame, the insulating film can be held more firmly.

In the multidirectional input device according to the present invention, movable electrode portions are fixed to first and second interlocking members, respectively, fixed electrode portions are fixed to a printed wiring board in opposition to the movable electrode portions respectively, the first and second interlocking members are rotated, centered on the longitudinal directions of first and second slots, respectively, thereby rotating the movable electrode portions, whereby an opposition area between each movable electrode and the fixed electrode opposed thereto is changed, and the resulting change in capacitance between both electrode portions is detected to obtain an operational direction of the operating shaft. Thus, the movable and fixed electrode portions can be fixed together easily and the multidirectional input device becomes less expensive because the number of parts used is small In the multidirectional input device according to the present invention, one end portions of the first and second interlocking members are projected outwards from a frame, the movable electrode portions are fixed to those end portions respectively and the fixed electrode portions are located outside the frame. Thus, since the end portions of the first and second interlocking members are projected outwards from the frame, the movable electrode portions can be fixed more easily to those end portions. Besides, the fixing of the fixed electrode portions can also be done more easily because the fixed electrode portions are located outside the frame. Consequently, the multidirectional input device can be provided less expensively.

In the multidirectional input device according to the present invention, an earth electrode and a first fixed electrode are both opposed to the associated movable electrode portion, and a change in capacitance between the first fixed electrode and the movable electrode portion caused by rotation of the movable electrode portion is detected trough the earth electrode opposed to the movable electrode portion. According to this configuration, an electric circuit is formed by the first fixed electrode, the movable electrode portion and the earth electrode and hence wiring of the movable electrode portion becomes unnecessary. Consequently, the layout of electrodes becomes easier and the manufacturing cost of the multidirectional input device is reduced.

In the multidirectional input device according to the present invention, when the operating shaft is in its vertical position relative to the printed wiring board, an opposition area between the first fixed electrode and the movable electrode portion and that between the second fixed electrode and the movable electrode portion are equal to each other and changes in capacitance between the first fixed electrode and the movable electrode portion and between the second fixed electrode and the movable electrode portion caused by rotation of the movable electrode portion are detected through earth electrodes opposed to the movable electrode portion. Thus, it can be easily detected that the vertical position of the operating shaft with respect to the printed wiring board corresponds to a neutral point in the multidirectional input device. By this detection, the tilting operability of the multidirectional input device can be maintained in a satisfactory condition.

In the multidirectional input device according to the present invention, metallic plates serving as movable electrode portions are press-fitted respectively into slits formed in the first and second interlocking members, and metallic plates serving as fixed electrode portions are soldered directly to the printed wiring board. Thus, both movable and fixed electrode portions can be mounted extremely easily and the multidirectional input device is so much reduced in cost.

What is claimed is:

1. A multidirectional input device comprising:

a frame having an upper wall;

a printed wiring board which closes a lower portion of the frame and which has a fixed electrode portion; and an operating shaft supported by the frame and adapted to be tilted with respect to the upper wall of the frame, wherein a movable electrode portion is attached to the operating shaft in an opposed relation to the fixed electrode portion and is moved by operation of the operating shaft to change an opposition area between the movable electrode portion and the fixed electrode portion, and a change in capacitance between the movable electrode portion and the fixed electrode portion is detected to obtain an operational direction of the operating shaft, and an interlocking member having a longitudinal slot is mounted bridgewise in an interior of the frame, the operating shaft is inserted into the slot and is supported by the interlocking member, the operating shaft can be tilted in both the longitudinal direction of the slot and a direction intersecting the longitudinal direction of the slot, and when the operating shaft is tilted in the longitudinal direction of the slot, only the operating shaft rotates, while when the operating shaft is tilted in the direction intersecting the longitudinal direction of the slot, the interlocking member rotates, centered on the longitudinal direction, with rotation of the operating shaft.

2. A multidirectional input device according to claim 1, wherein a slide member is disposed on an upper surface of the printed wiring board so that the slide member can be moved along the upper surface of the printed wiring board by a tilting motion of the operating shaft, and the movable electrode portion is fixed to the slide member and is moved in parallel with the fixed electrode portion by the tilting motion of the operating shaft.

3. A multidirectional input device according to claim 1, wherein the fixed electrode portion is formed by a conductor pattern on an upper surface of the printed wiring board.

4. A multidirectional input device according to claim 1, wherein the fixed electrode portion has an earth electrode and a first fixed electrode adjacent to the earth electrode, the earth electrode and the first fixed electrode being opposed to the movable electrode portion, and a change in capacitance between the fixed electrode portion and the movable electrode portion caused by movement of the movable electrode portion is detected through the earth electrode opposed to the movable electrode portion.

5. A multidirectional input device according to claim 1, wherein:

the fixed electrode portion comprises four earth electrodes arranged crosswise and first, second, third and fourth fixed electrodes each disposed between adjacent earth electrodes, the fixed electrode portion is formed in a generally circular shape by the earth electrodes and the first, second, third, and fourth fixed electrodes, the earth electrodes and the first, second, third, and fourth fixed electrodes being opposed to the movable electrode portion which is formed in a circular shape, changes in capacitance between each of the first, second, third, and fourth fixed electrodes and the movable electrode portion caused by movement of the movable electrode portion are detected through the earth electrodes opposed to the movable electrode portion;

a displacement in an X direction of the operating shaft is detected by calculating a difference between a sum of a capacitance value between the first fixed electrode and the movable electrode portion and a capacitance value between the second fixed electrode and the movable electrode portion and a sum of a capacitance value between the third fixed electrode and the movable electrode portion and a capacitance value between the fourth fixed electrode and the movable electrode portion;

a displacement in a Y direction of the operating shaft is detected by calculating a difference between a sum of a capacitance value between the first fixed electrode and the movable electrode portion and a capacitance value between the fourth fixed electrode and the movable electrode portion and a sum of a capacitance value between the second fixed electrode and the movable electrode portion and a capacitance value between the third fixed electrode and the movable electrode portion; and a tilting direction of the operating shaft is detected from the calculation results of the displacements in the X and Y directions.

6. A multidirectional input device according to claim 1, wherein an insulating film is disposed between the movable electrode portion and the fixed electrode portion, and the movable electrode portion slides in contact with an upper surface of the insulating film.

7. A multidirectional input device according to claim 6, wherein the insulating film is disposed on the printed wiring board so as to cover the fixed electrode portion and is sandwiched between the printed wiring board and the lower portion of the frame.

8. A multidirectional input device comprising:

a first interlocking member having a first longitudinal slot;

a second interlocking member disposed in a direction orthogonal to the longitudinal direction of the first interlocking member and having a second longitudinal slot;

a frame within which the first and second interlocking members are bridgewise mounted rotatably;

a printed wiring board which closes a lower portion of the frame; and an operating shaft inserted into the first and second slots, supported by the first and second interlocking members and adapted to tilt in the longitudinal directions of the first and second slots, wherein movable electrode portions are fixed to the first and second interlocking members respectively, fixed electrode portions are fixed to the printed wiring board in an opposed relation to the movable electrode portions, the first and second interlocking members are rotated, centered on the longitudinal directions of the first and second slots respectively, by operation of the operating shaft, thereby rotating the movable electrode portions to change an opposition area between each movable electrode portion and each fixed electrode portion, and a change in capacitance between each movable electrode portion and each fixed electrode portion is detected to obtain an operational direction of the operating shaft.

9. A multidirectional input device according to claim 8, wherein one end portion of the first and second interlocking members project outwards from the frame, the movable electrode portions are fixed to the end portions respectively, and the fixed electrode portions are disposed outside the frame.

10. A multidirectional input device according to claim 8, wherein the fixed electrode portions each comprise an earth electrode and a first fixed electrode adjacent to the earth electrode, the earth electrode and the first fixed electrode being opposed to the associated movable electrode portion, and a change in capacitance between the first fixed electrode portion and the associated movable electrode portion caused by rotation of the movable electrode portion is detected through the earth electrode opposed to the movable electrode portion.

11. A multidirectional input device according to claim 8, wherein the fixed electrode portions each comprise an earth electrode and a pair of first and second fixed electrodes adjacent to both sides of the earth electrode, the earth electrode and the first and second fixed electrodes being opposed to the associated movable electrode portion, an opposition area between the first fixed electrode and the associated movable electrode portion and an opposition area between the second fixed electrode and the movable electrode portion are equal to each other when the operating shaft is in a position perpendicular to the printed wiring board, and a change in capacitance between the first fixed electrode and the associated movable electrode portion and a change in capacitance between the second fixed electrode and the movable electrode portion both caused by rotation of the movable electrode portion are detected through the earth electrode opposed to the movable electrode portion.

12. A multidirectional input device according to claim 8, wherein the movable electrode portions and the fixed electrode portions are respectively formed by metallic plates, one end portions of the metallic plates serving as the movable electrode portions are press-fitted into slits formed in the first and second interlocking members respectively, and the metallic plates serving as the fixed electrode portions are soldered directly to the printed wiring board.

* * * * *